United States Patent
Higuchi

(10) Patent No.: US 6,948,046 B2
(45) Date of Patent: Sep. 20, 2005

(54) ACCESS CONTROLLER THAT EFFICIENTLY ACCESSES SYNCHRONOUS SEMICONDUCTOR MEMORY DEVICE

(75) Inventor: Ryohei Higuchi, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 254 days.

(21) Appl. No.: 10/317,127

(22) Filed: Dec. 12, 2002

(65) Prior Publication Data

US 2003/0229750 A1 Dec. 11, 2003

(30) Foreign Application Priority Data

Jun. 7, 2002 (JP) ........................................ 2002-167641

(51) Int. Cl.[7] .......................... G06F 12/00; G06F 12/06
(52) U.S. Cl. ........................... 711/217; 711/218; 711/5; 711/105; 711/154; 711/201; 365/238.5; 365/230.03
(58) Field of Search .......................... 365/238.5, 230.03; 711/217, 218, 201, 105, 5, 154

(56) References Cited

U.S. PATENT DOCUMENTS

| | | | | |
|---|---|---|---|---|
| 4,918,645 A | * | 4/1990 | Lagoy, Jr. ................... | 711/151 |
| 5,297,029 A | * | 3/1994 | Nakai et al. .............. | 365/238.5 |
| 6,229,759 B1 | * | 5/2001 | Morgan ....................... | 365/236 |
| 6,282,622 B1 | * | 8/2001 | Morris ........................ | 711/170 |
| 6,385,205 B1 | * | 5/2002 | Romero ....................... | 370/401 |
| 6,438,063 B1 | * | 8/2002 | Lee ........................ | 365/230.03 |

FOREIGN PATENT DOCUMENTS

| | | | | |
|---|---|---|---|---|
| JP | 7-105082 | 4/1995 | | |
| JP | 7-248963 | 9/1995 | | |
| JP | 11025696 A | * | 1/1999 | ........... G11C/29/00 |

* cited by examiner

Primary Examiner—Hong Kim
(74) Attorney, Agent, or Firm—Burns, Doane, Swecker & Mathis, L.L.P.

(57) ABSTRACT

An SDRAM access control section activates a row of an SDRAM when a request is made to access the row in the continuous access mode. The SDRAM access control section outputs a read command or a write command to the SDRAM 300 when a request is made to access the SDRAM 300, without deactivating the accessed row, until a detection signal that detects the last column is asserted. The SDRAM access control section deactivates the accessed row when the detection signal is asserted.

6 Claims, 12 Drawing Sheets

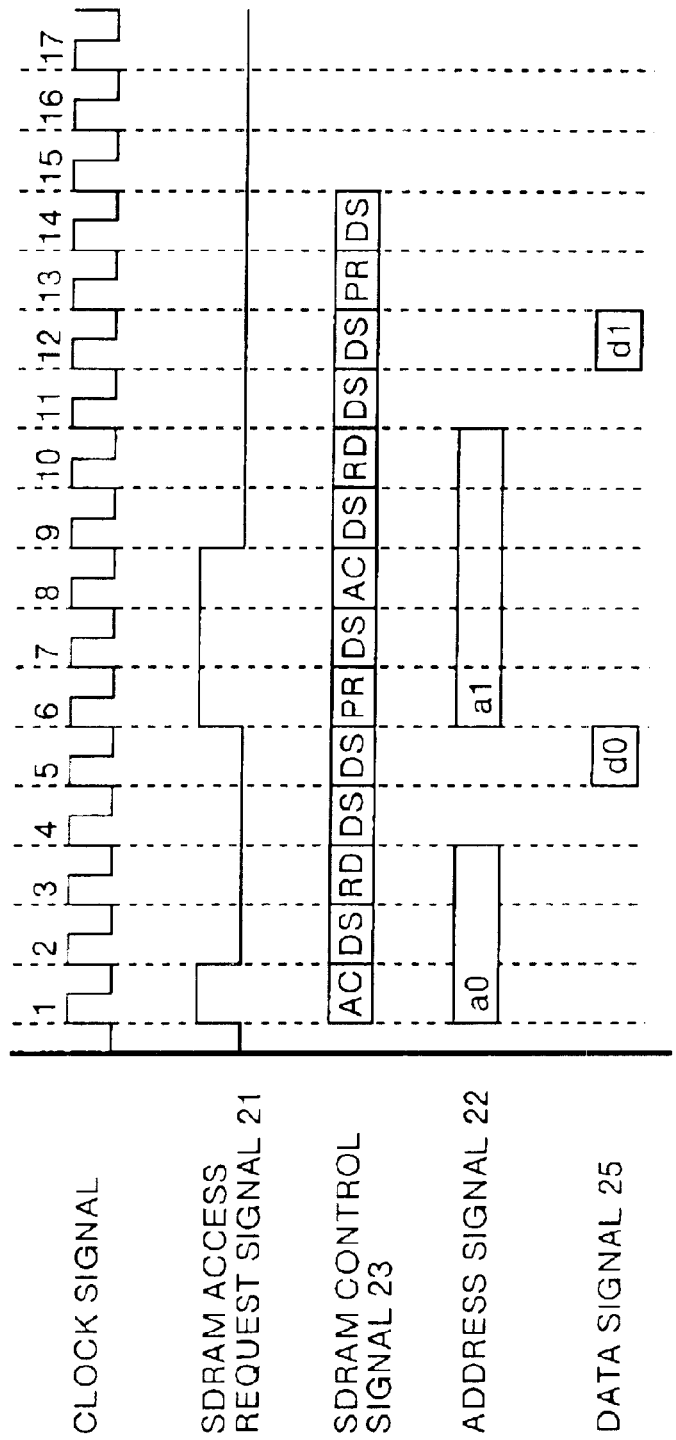

ACCESS CONTROLLER THAT EFFICIENTLY ACCESSES SYNCHRONOUS SEMICONDUCTOR MEMORY DEVICE

BACKGROUND OF THE INVENTION

1) Field of the Invention

The present invention relates to a controller that controls an access to a synchronous semiconductor memory device.

2) Description of the Related Art

The operating speed of the microprocessors has been constantly improving. Dynamic random-access memories (DRAMs) that operate synchronously with the clock signal (i.e., SDRAMs), which can be accessed speedily, have appeared in the market. The internal operation of the SDRAM is divided into row series operation and column series operation.

The SDRAM has a bank structure in which a memory cell array is divided into independent banks. This structure makes the operating speed of the SDRAM faster.

FIG. 12 shows a large scale integration (LSI) 3 that includes a conventional SDRAM control module 90. The SDRAM control module 90 includes an SDRAM access control section 1. The SDRAM access control section 1 generates an SDRAM control signal 23. The SDRAM control signal 23 may be a row address strobe signal RAS, column address strobe signal CAS, WE signal, or CS signal. The SDRAM access control section 1 also generates an address signal 24 that contains a bank address. The SDRAM access control section 1 generates the SDRAM control signal 23 based on the input of a signal 21. The signal 21 (access request signal) requests access to the SDRAM 300. The SDRAM access control section 1 generates the address signal based on the input of an address signal 22. The SDRAM control signal 23 and the address signal 24 are input into the SDRAM 300 at a predetermined timing to write and read a data signal 25 onto and from the SDRAM 300.

The operation for reading data from the SDRAM is explained next. The signal 21 and the address signal 22 are input into the SDRAM control module 90 from a module that is not shown in the figure. The SDRAM access control section 1 issues a row activation command AC, a read command RD, and a bank deactivation command PR to the SDRAM 300 after receiving the signal 21 and the address signal 22. The bank deactivation command PR is a precharge command. These commands are generated based on a combination of high logical level (H) and low logical level (L) of the SDRAM control signals 23 that could be the RAS, CAS, WE, CS signals. The address signal 22 is processed into a format suited for the SDRAM 300 by multiplexing process. The address signal 22 is transmitted to the SDRAM 300 by the SDRAM access control section 1 in the form of the address signal 24. A row address and then a column address is transmitted to the SDRAM 300. The SDRAM 300 outputs the data signal 25 to a data bus after passing through the CAS latency on execution of the read command RD. The data signal 25 output from the SDRAM 300 is read by a module, which is not shown in the diagram, in LSI 3.

FIG. 13 is a time chart that explains the operation in detail. It has been assumed here that the same row in the same bank of the SDRAM 300 is accessed twice. The burst output length when transferring the burst of the SDRAM 300 is 1 and is programmed before accessing the SDRAM 300.

The signal 21 is asserted in clock cycle 1. As a result, the SDRAM access control section 1 issues a row activation command AC. Then, the SDRAM access control section 1 issues a read command RD in clock cycle 3. The SDRAM access control section 1 issues a deselect command DS in clock cycle 2, i.e., between the row activation command AC and the read command RD. It is assumed here that two clock cycles are required for RAS-CAS latency.

The SDRAM access control section 1 issues a bank deactivation command PR to deactivate the bank in clock cycle 6. It is assumed that five clock cycles are required from the issuance of the row activation command AC before the issuance of the bank deactivation command PR. Moreover, it is assumed that after the read command RD is issued in cycle 3, two clock cycles are required for CAS latency. Hence, the data signal 25 is output to the data bus in clock cycle 5.

The signal 21 is again asserted, i.e., in clock cycle 6, after the data (d0) of the SDRAM is output. The SDRAM requires two clock cycles from the issue of bank deactivation command PR until the issue of row activation command AC. Hence, the SDRAM row activation command AC is issued in clock cycle 8. A second SDRAM access (a1) is performed like the first SDRAM access (a0). The second SDRAM read data (d1) is output in clock cycle 12. In this example, twelve clock cycles are required from the first SDRAM access request until the output of the second SDRAM access data.

According to the conventional SDRAM control module, the cycle of the row activation AC and bank deactivation PR are repeated in the same row, each time the signal 21 is asserted. Therefore, the process is inefficient because many clock cycles are required when the same row in the same bank is continuously accessed many times.

SUMMARY OF THE INVENTION

It is an object of the invention to provide an access controller that can decrease the number of clock cycles required to access the SDRAM. It is also an object of the present invention to ensure efficient access of memory when the same row in the bank is accessed continuously.

The access controller according to the present invention comprises of a plurality of last column detection circuit, a selecting circuit that selects the last column detection signal, and an access control section. One last column detection circuit is provided for each bank. Each last column detection circuit detects the access to a last column address in the continuous access mode and generates a last column detection signal. The selecting circuit selects one last column detection signal from among the last column detection signals generated by the last column detection circuits based on an address signal. The access control section activates the row of the synchronous semiconductor memory device when the row is accessed in the continuous access mode, outputs a read command or a write command without deactivating the accessed row, and deactivates the accessed row when the last column detection signal is asserted from the select circuit.

These and other objects, features and advantages of the present invention are specifically set forth in or will become apparent from the following detailed descriptions of the invention when read in conjunction with the accompanying drawings.

BRIEF DESCRIPTION OF THE DRAWINGS

FIG. 13 is a time chart that explains the operation of the conventional access controller.

DETAILED DESCRIPTIONS

The embodiments of the present invention are explained below, with reference to the accompanying drawings.

Figure 1:
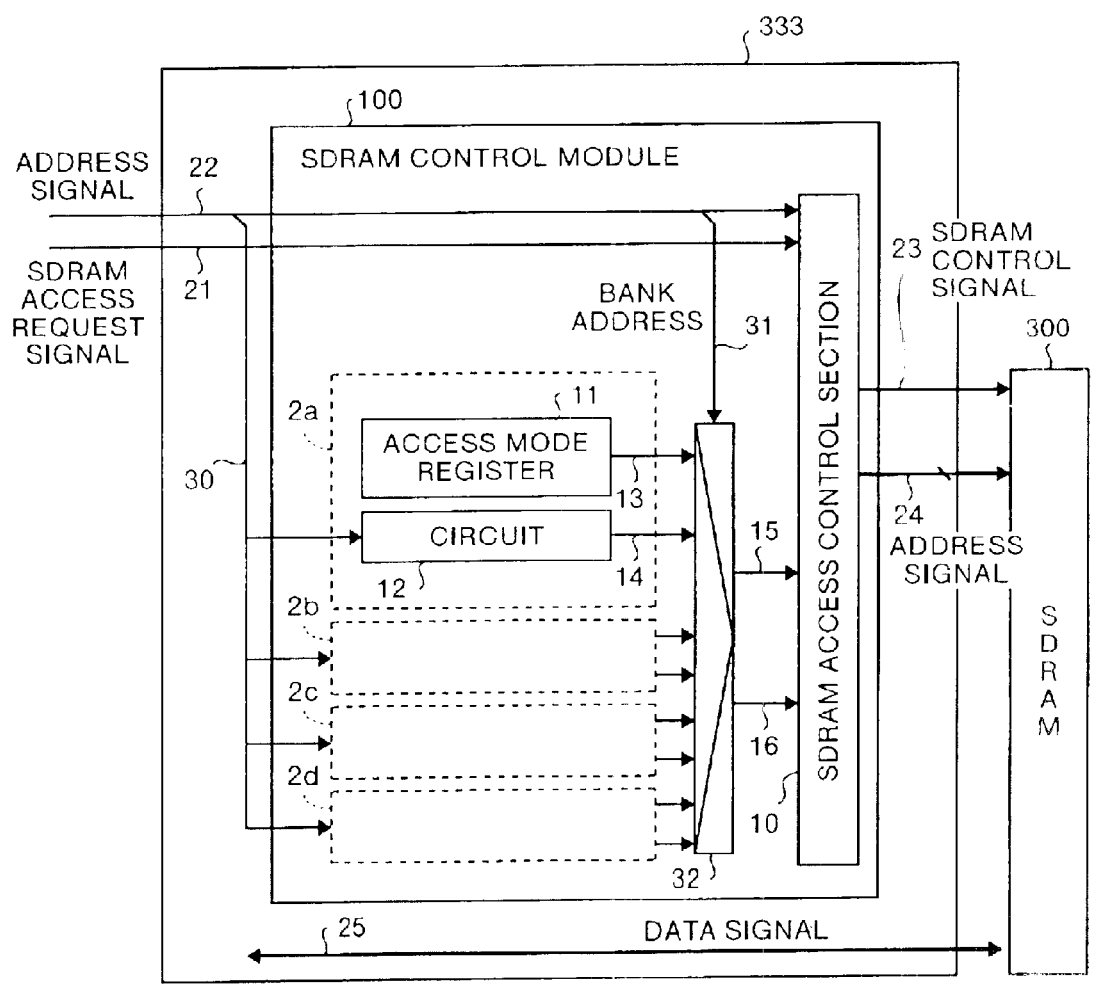
FIG. 1 is a block diagram which shows the configuration of an access controller according to a first embodiment of the present invention.

FIG. 1 shows an LSI 333 according to the first embodiment of the present invention. This LSI 333 includes an SDRAM control module 100 and an SDRAM 300, however, the SDRAM 300 may not be provided. The SDRAM 300 is divided into i banks. In FIG. 1, i is equal to four, i.e., the SDRAM 300 is divided into banks 0 to 3. The SDRAM control module 100 includes a plurality of continuous access control units 2a to 2d, a selecting circuit 32, and an SDRAM access control section 10. The continuous access control units 2a to 2d correspond to banks 0 to 3 of the SDRAM 300. The selecting circuit 32 selects a signal from among signals output by the continuous access control units 2a to 2d based on a bank address 31.

Figure 2:
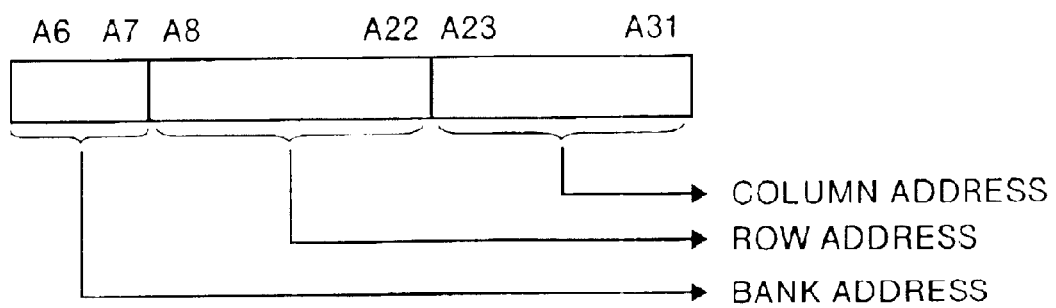
FIG. 2 shows an example of the address structure of an SDRAM.

FIG. 2 shows an example of the SDRAM address. The SDRAM address consists of a bank address, a row address and a column address. The bank address consists of A6 to A7 of two bits, the row address consists of A8 to A22 of 15 bits, and the column address consists of A23 to A31 of nine bits. An address signal 22 with the address from A6 to A31 is input into the SDRAM access control section 10. From the address signal 22, 10 bit address of A22 to A31, i.e., the address signal 30, is input into each of the continuous access control units 2a to 2d. Why nine bits (i.e., A23 to A31) of address signal 22 are not input, but 10 bits (i.e., A22 to A31) are input into the continuous access control units 2a to 2d will be explained later. From the address signal 22, two bit A6 and A7, i.e., the bank address 31 is input into the selecting circuit 32.

Each of the continuous access control units 2a to 2d includes an access mode register 11 and a circuit 12. The access mode register 11 accesses the bank of the SDRAM 300 in either a continuous access mode or a single access mode. The access mode register 11 outputs the information to the selecting circuit 32 as a bank i access mode signal 13 where i=1 to 3. The circuit 12 detects the last column of a row in a bank. The circuit 12 outputs a signal 14 that detects the last column of bank i to the selecting circuit 32 when the last column of the row in the bank is detected.

Figure 3:
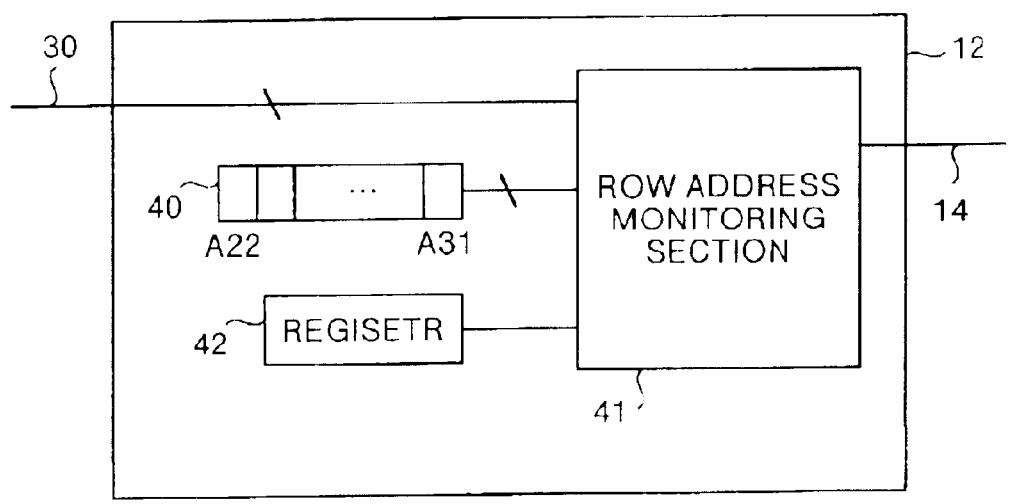
FIG. 3 is a block diagram that shows the internal configuration of a circuit that detects the last column in the access controller according to the first embodiment.

FIG. 3 shows the internal configuration of the circuit 12. The circuit 12 includes a registers 40 and 42, and a row address monitoring section 41. The register 40 sets a value that indicates the portion of the column address corresponding to the SDRAM address. The register 42 sets a value that indicates the direction in which the column address 30 progresses when the SDRAM is continuously accessed. The direction in which the column address progresses maybe incremental or decremental. The row address monitoring section 41 monitors the column address 30 based on the values of the register 42 and the register 40. The register 40 sets information only up to ten bits of the SDRAM from A22 to A31. As shown in FIG. 2, the column address consists of A23 to A31 of nine bits. Hence 0111111111 is set in the register 40 with the highest bit as 0.

The row address monitoring section 41 activates a signal 14 that detects the last column of bank i when there is an incremental progress of the column address 30 that is indicated in register 42. In this case, the column address 30 of A23 to A31 is set at 1 corresponding to the bits set at 1 in the register 40. The section 41 also activates the signal 14 when there is a decremental progress of column address 30. In this case, the column address 30 is set at 0 corresponding to the bits set at 1 in the register 40.

The selecting circuit 32 selects a set of bank i access mode signal 13 and signal 14 from the four continuous access control units 2a to 2d. The selected signals of 13 and 14 are input into the SDRAM access control section 10 as the SDRAM access mode signal 15 and the signal 16, respectively. The signal 16 detects the last column of the row.

The SDRAM access control section 10 generates SDRAM control signal 23 based on the access mode signal 15. The signal 16 is input from the selecting circuit 32 to the SDRAM access control section 10. A signal 21 that requests access to SDRAM is input into the SDRAM access control section. In addition, the SDRAM access control section 10 processes the input address signal 22 into a suitable format by multiplexing process. The address signal 24 and the SDRAM control signal 23 are input into the SDRAM 300 in the order of row address and column address. The data signal 25 is written to the SDRAM 300 and read from the SDRAM 300 in response to the input of the address signal 24 and the SDRAM control signal 23 into the SDRAM 300.

The operation for reading data from the SDRAM is explained next. The access mode register 11 stores information about the mode in which the SDRAM 300 is accessed. The SDRAM maybe accessed in a continuous access mode or a single access mode. The signal 21 and the address signal 22 are input into the SDRAM control module 100 from a module that is not shown in the diagram. The signal 21 accesses the bank 0 of SDRAM 300.

A case will be explained here that assumes that a value that indicates a single access mode has been set in the continuous access control units 2a in the access mode register 11 that corresponds to bank 0 of SDRAM 300. The selecting circuit 32 selects the bank i access mode signal 13, which indicates the single access mode, based on the bank address 31. The selecting circuit 32 outputs the selected signal to the SDRAM access control section 10 as the SDRAM access mode signal 15.

The SDRAM access control section 10 accesses the SDRAM 300 in the same manner as that of the conventional art. A row activation command AC, a read command RD, and a bank deactivation command PR are issued to the SDRAM 300. The SDRAM access control section 10 processes the address signal 22 into a suitable format for the SDRAM 300. The SDRAM access control section 10 outputs the address signal 24 to the SDRAM 300 in the order of row address and column address based on the input of the address signal 22. The read command RD is first issued to the SDRAM 300. The SDRAM 300 outputs the data signal 25 to a data bus after the passage of CAS latency. The data signal 25 which is output to the data bus is read by a module that is not shown in the diagram.

A case will now be explained here that assumes that a value that indicates a continuous access mode has been set in the continuous access control units 2a in the access mode register 11 that corresponds to bank 0 of SDRAM 300. The selecting circuit 32 selects the bank i access mode signal 13, which indicates the continuous access mode, based on the bank address 31. The bank i access mode signal 13 corresponds to bank 0 of SDRAM 300. The selecting circuit 32 outputs the selected signal to the SDRAM access control section 10 as the SDRAM access mode signal 15.

The SDRAM access control section 10 identifies the continuous access mode of the SDRAM access mode signal 15. If the signal 16 from the selecting circuit 32 is not active, the SDRAM access control section 10 issues the row activation command AC to bank 0 when a row is accessed for the first time. Then the SDRAM access control section 10 issues the read command RD. The SDRAM access control section 10 awaits the next access of the same row. The SDRAM access control section 10 continues to maintain the active state of the row without issuing a deactivation command. If the next column of the same row is accessed, the SDRAM access control section 10 does not issue a new row activation command AC. Instead, the SDRAM access control section 10 issues a read command RD as the row is in an active state. In this manner the operation is carried out till the last column in the same row is accessed.

The circuit 12 in the continuous access control units 2a detects the access of the last column of the same row and activates the last column detection signal 14. The last column detection signal 14 is input into the selecting circuit 32. The selecting circuit 32 converts the last column detection signal 14 to the signal 16 and inputs the signal 16 into the SDRAM access control section 10. If the signal 16 is activated, the SDRAM access control section 10 deactivates the bank 0. The SDRAM access control section 10 deactivates the bank 0 by precharging. During deactivation of bank 0, the row that is designated by the address signal 22 is deactivated. When the bank 0 is accessed the next time, the SDRAM access control section 10 activates a new row and repeats the same operation.

Figure 4:
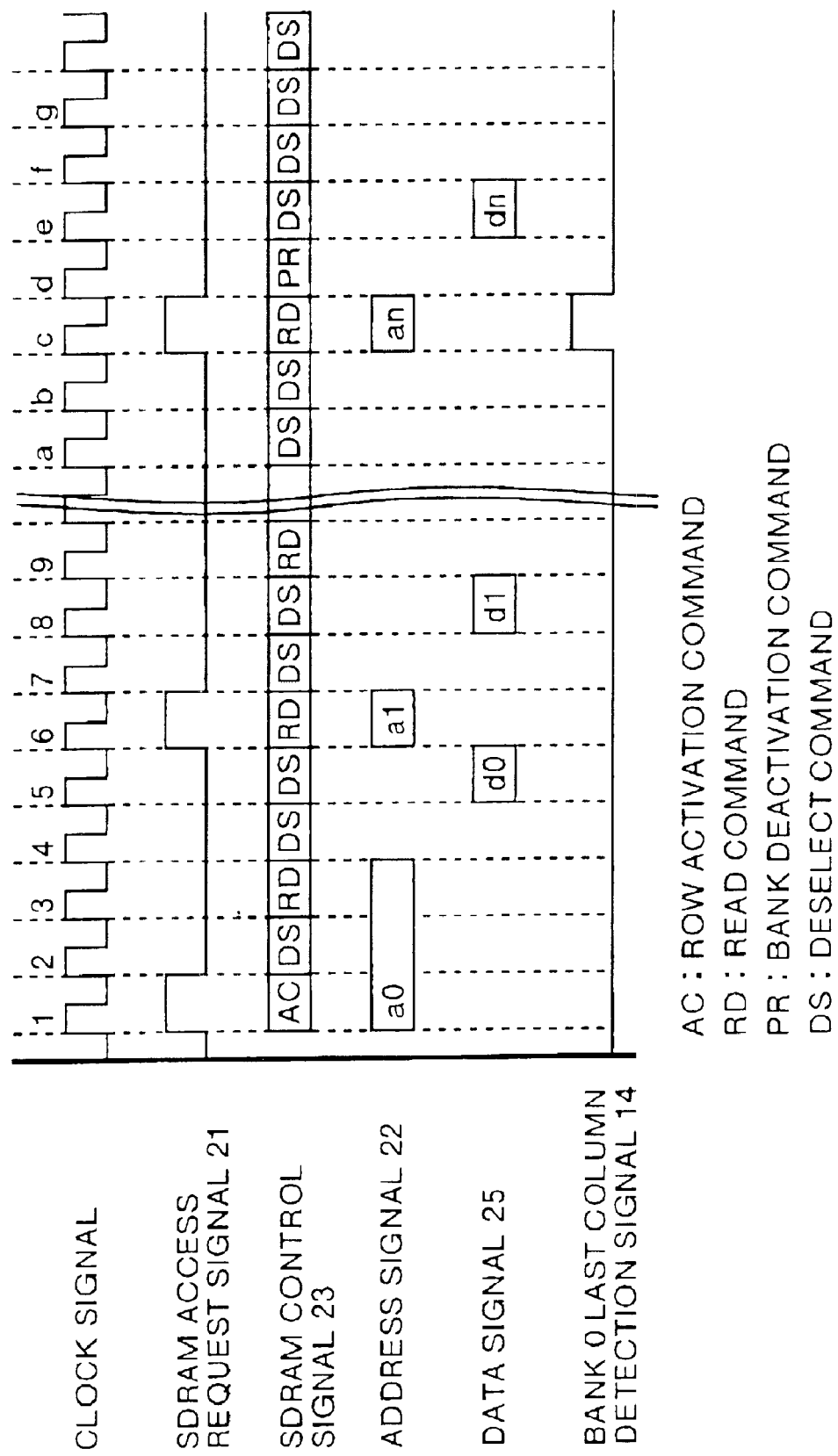
FIG. 4 is a time chart that explains the operation of the access controller according to the first embodiment in a continuous access mode.

FIG. 4 explains the process of continuous access mode in detail. When the signal 21 is input into the SDRAM 300, the address signal 22 is updated as the continuous column addresses for the same row address. The continuous column addresses are updated as a0, a1, and the like.

The signal 21 is asserted in clock cycle 1. The SDRAM access control section 10 issues a row activation command AC to activate a row in the bank 0 of the SDRAM 300. The SDRAM access control section 10 issues a deselect command DS in the clock cycle 2. The SDRAM access control section 10 issues a read command RD in clock cycle 3. After the passage of CAS latency, the SDRAM 300 outputs the data signal 25 to the data bus in clock cycle 5. The CAS latency takes place during two clock cycles of the deselect command DS.

When the read command RD is issued in clock cycle 3, the circuit 12 checks the column address 30 portion in the address signal 22 and detects that the last column is not accessed. Therefore, the signal 16 is negated. The SDRAM access control section 10 then issues the deselect command DS in clock cycles 4 and 5. The bank 0 continues to be maintained in the activated state.

The signal 21 is input in clock cycle 6. The SDRAM access control section 10 does not issue the row activation command AC. Instead, the SDRAM access control section 10 directly issues the read command RD as the signal 16 is negated. The SDRAM 300 outputs the data signal 25 (d1) to the data bus in clock cycle 8 after the passage of CAS latency. Eight clock cycles are required from issuance of the first SDRAM access request signal 21 until the output of the second access data (d1). The operation is carried out till the last column of the same row is accessed.

The signal 21 is input into clock cycle c. If the last column in the row is accessed, the circuit 12 detects the access to the last column in the row. The circuit 12 activates the last column detection signal 14. As a result, the signal 16 is also activated. The signal 16 is output from the selecting circuit 32. If the signal 21 is again input in clock cycle c, the signal 16 is activated. The SDRAM access control section 10 outputs the read command RD in clock cycle c. The SDRAM access control section 10 issues the deactivation command PR in clock cycle d to deactivate the selected row of bank 0. The SDRAM 300 outputs the data signal 25 to the data bus in clock cycle e after the passage of CAS latency.

According to the first embodiment, in the continuous access mode the row is activated when the first access is made and the read command RD is issued. The bank deactivation and row activation does not take place until the last column of the next row is accessed. The row address is the same and the column addresses are continuous. It is thus possible to decrease the number of clock cycles required for SDRAM access. The efficient access of memory is also ensured.

Figure 5:
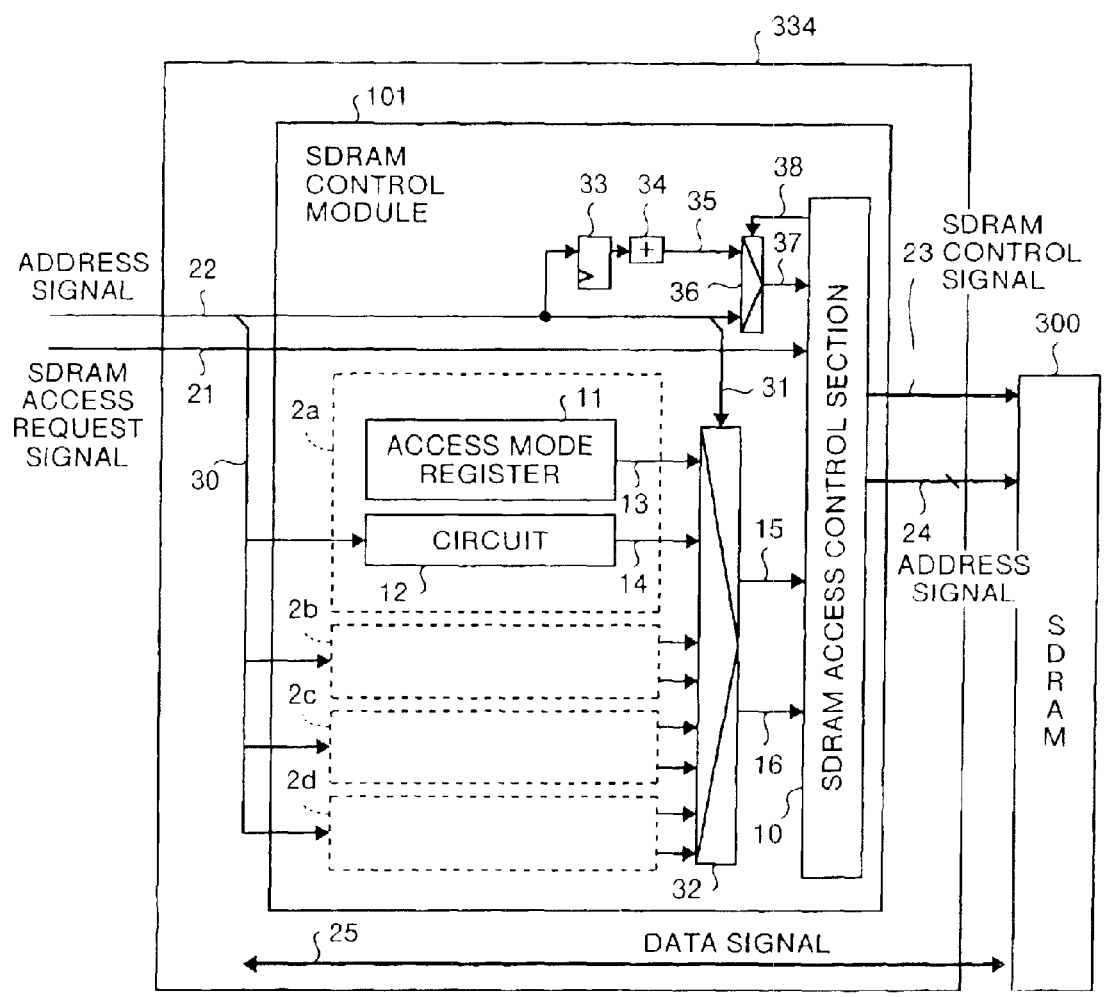
FIG. 5 is a block diagram that shows the configuration of an access controller according to a second embodiment of the present invention.

A second embodiment of the present invention is explained with reference to FIGS. 5 and 6. As shown in FIG. 5, an LSI 334 includes an SDRAM control module 101 and an SDRAM 300. The SDRAM control module 101 consists of an address holding section 33, an adder 34, and a circuit 36. The adder 34 performs a +1 incremental operation. The circuit 36 selects the address.

The address holding section 33 temporarily holds the SDRAM address signal 22 and outputs the SDRAM address signal 22 to the adder 34. The adder 34 increments the value of the address by +1. The next address signal 35 with continuous column addresses, in the continuous access mode, is calculated by the adder 34. The incremented address signal 35 is input into the circuit 36. The circuit 36 selects the SDRAM address signal 22 or the next address signal 35 that is input from the adder 34. The circuit 36 does the selection based on a control signal 38 that selects the address. The control signal 38 is input from the SDRAM access control section 10.

The SDRAM access control section 10 sets the level of the control signal 38 at L, for example, when other than the last column is accessed. The control signal 38 is set at L during the single access mode or the continuous access mode. During the continuous access mode, when the last column is accessed, the SDRAM access control section 10 sets the level of the control signal 38 at H. If the control signal 38 is L, the circuit 36 selects the SDRAM address signal 22 that is input into the SDRAM access control section 10. If the control signal 38 is H, the circuit 36 selects the next address signal 35. The next address signal 35 is then input into the SDRAM access control section 10.

The operation of the second embodiment will be explained with reference to the time chart shown in FIG. 6. The operation for reading data from SDRAM 300 in the continuous access mode is explained. In the single access mode, the operation is the same as that of the first embodiment.

The circuit 36 selects the SDRAM address signal 22 during the continuous access mode or when other than the last column is being accessed. The circuit 36 selects the SDRAM address signal 22 based on the control signal 38. The continuous access control units 2a to 2d, the selecting circuit 32 and the SDRAM access control section 10 operate in the same manner as that explained in the first embodiment. As shown in FIG. 6, the process from clock cycle 1 to 8 is the same as that of the first embodiment. During the process, the next address signal 35 is updated as the SDRAM address signal 22 is incremented by +1 when the signal 21 is input each time. However, during the reading process, as the circuit 36 does not select the next address signal 35, the next address signal 35 is not used.

The signal 21 is input in clock cycle c and the last column in the row is accessed, and the circuit 12 detects the access of the last column in the row. As a result, the signal 16 is activated. If the signal 21 is input in clock cycle c, the SDRAM access control section 10 outputs the read command RD in the clock cycle c. The SDRAM access control section 10 issues the deactivation command PR in the clock cycle d to deactivate the bank 0. The SDRAM access control section 10 deactivates the bank 0 as the signal 16 is activated. The SDRAM 300 outputs the data signal 25 to the data bus in clock cycle e after the passage of CAS latency.

If the signal 16 is input into the SDRAM access control section 10, the SDRAM access control section 10 changes the control signal 38 from L to H in clock cycle e. The circuit 36 changes the next address signal 35 to the SDRAM address signal 37 in the clock cycle e. The SDRAM access control section 10 sets the control signal 38 at L when it is other than the predetermined period. The SDRAM access control section 10 sets the control signal 38 at L after the signal 16 is asserted to select the next address signal 35. The SDRAM access control section 10 sets the control signal 38 at during the predetermined period. The SDRAM access control section 10 sets the control signal 38 at H after the signal 16 is asserted to select the next address signal 35.

Figure 6:
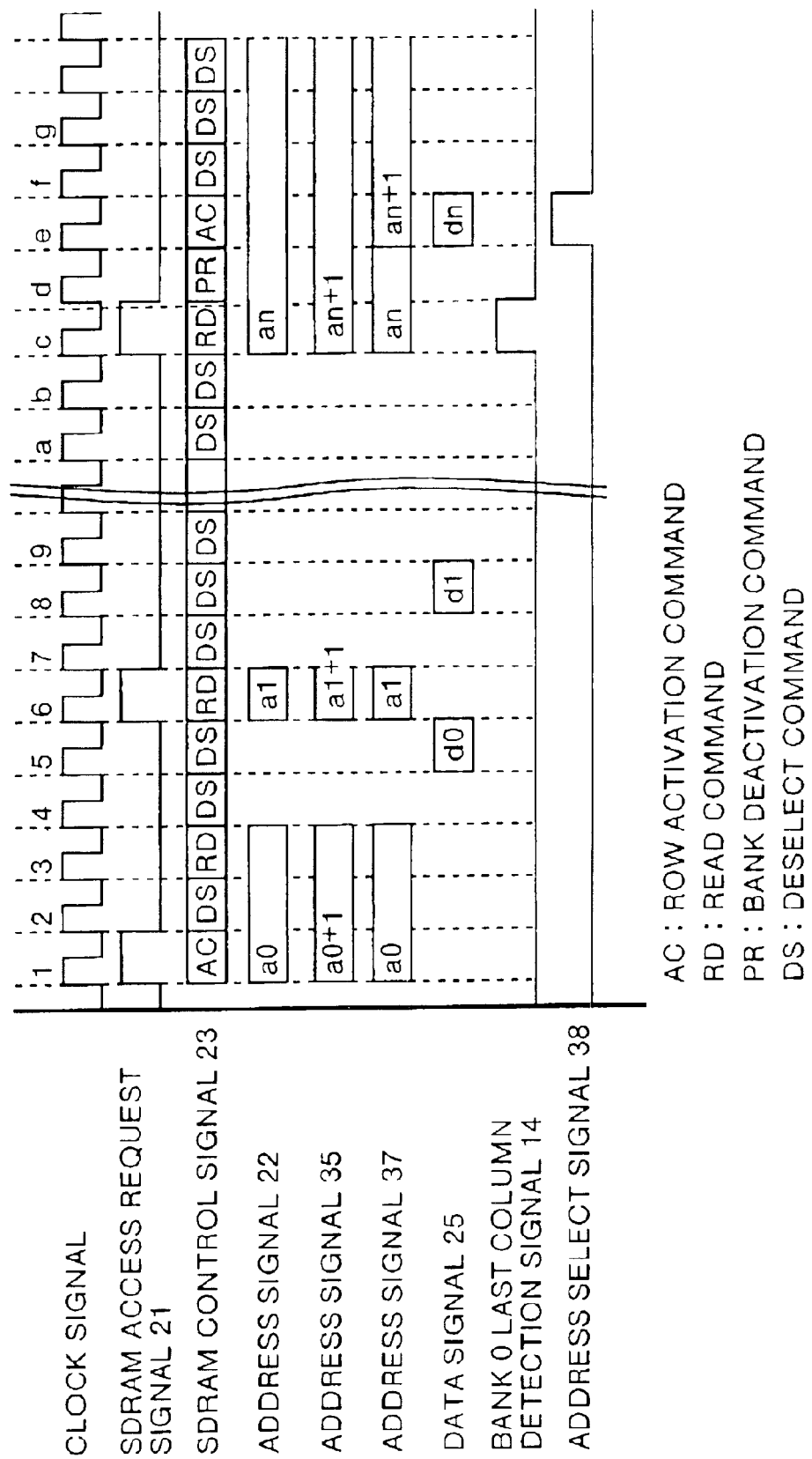
FIG. 6 is a time chart that explains the operation of the access controller according to the second embodiment in a continuous access mode.

As indicated in FIG. 6, the next address signal 35 has the first address in the next row. The next address signal 35 is indicated by $a_{n+1}$. The SDRAM access control section 10 activates the row of SDRAM 300 in clock cycle e by the row activation command AC. The row activation command AC is triggered by the SDRAM address signal 37. The row next to the accessed row is activated by the row activation command AC since the row address of the address signal 37 indicates the address of the row next to the accessed row.

According to the second embodiment of the present invention, the row is deactivated by the bank deactivation command PR after the last column in a row has been accessed. The next row is instantly activated before the request is made to the next column. Since the previous row is activated, it is possible to issue a read or write command if there is time before the request to access the next row is made. It is hence possible to decrease the number of clock cycles required to access SDRAM 300.

Figure 7:
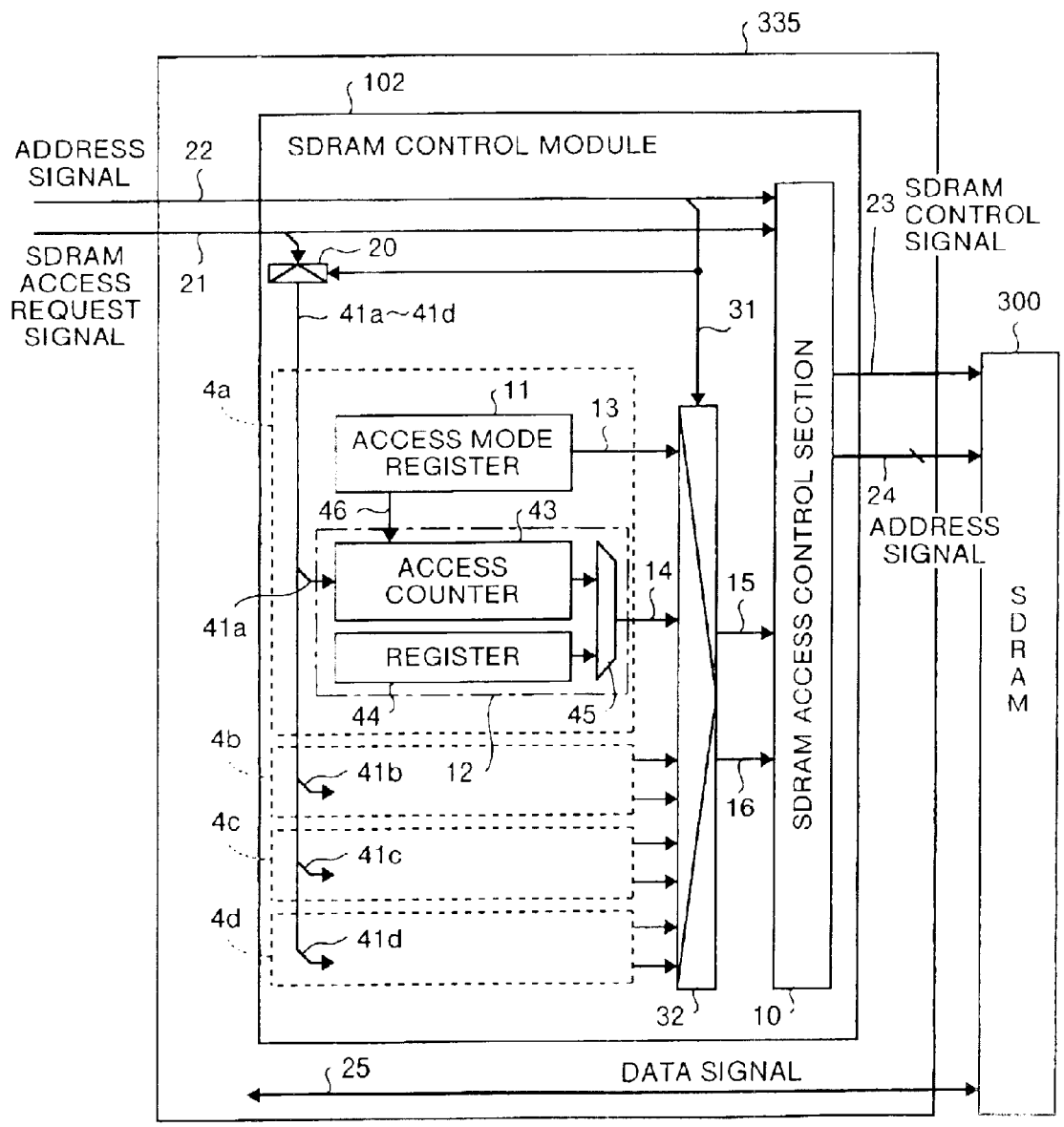
FIG. 7 is a block diagram that shows the configuration of an access controller according to a third embodiment of the present invention.
Figure 8:
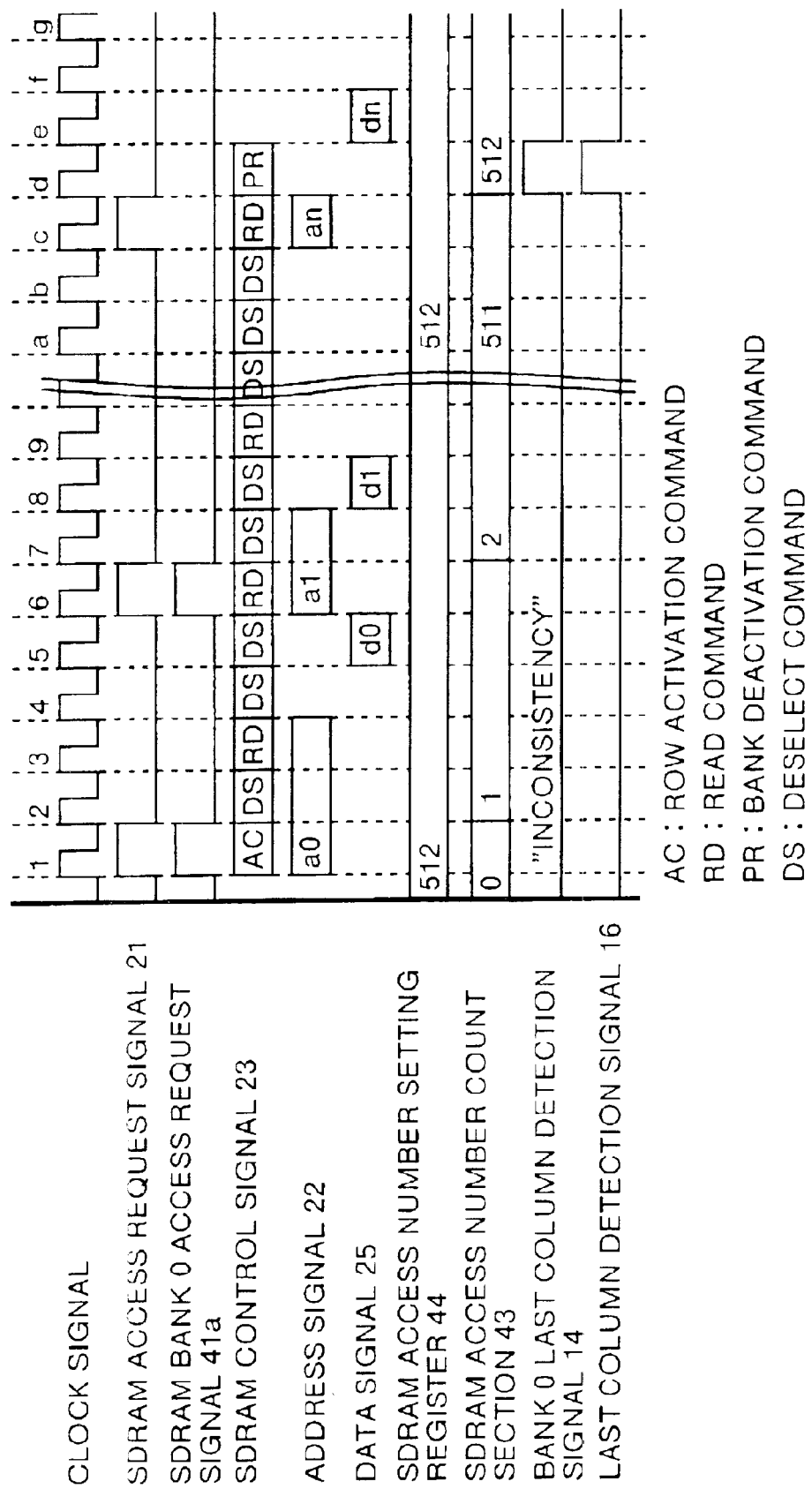
FIG. 8 is a time chart that explains the operation of the access controller according to the third embodiment in a continuous access mode.

A third embodiment of the present invention is explained with reference to FIGS. 7 and 8. FIG. 7 shows an LSI 335 that includes an SDRAM control module 103 and an SDRAM 300. The SDRAM control module 102 includes continuous access control units 4a to 4d. Each of the continuous access control units 4a to 4d includes the access mode register 11 and the circuit 12. The circuit 12 includes an access counter 43, a register 44, and a comparator 45. The access counter 43 counts the signal 21 and generates the signal 14. The address signal 22 and the column address 30 is not employed for the determination of the last column as in the first embodiment.

A distributor 20 distributes the signal 21 to the continuous access control units 4a to 4d based on the SDRAM bank address 31. The signals that requests access to bank 0 to 3 are signals 41a to 41b respectively. A signal within 41a to 41d that requests access to bank i is activated. The signal that requests access to bank i is designated by the SDRAM bank address 31. The continuous access control units 4a to 4d correspond to banks 0 to 3 respectively. The access mode register 11 stores information of whether the access made to the bank 0 is by continuous access mode or single access mode. The access mode register 11 also has information on the burst length. The circuit 12 detects the last column of the row in the corresponding bank.

The access counter 43 counts the number of times the SDRAM 300 is accessed. The register 44 sets the value of the number of times the SDRAM 300 is accessed. The comparator 45 compares the value set in register 44 with the count of the access counter 43.

A count control signal 46 is input from the access mode register 11 to the access counter 43. The count control signal 46 is activated, if the access mode register 11 has the value of continuous access mode. The access counter 43 performs a count operation when the count control signal 46 is activated. The access counter 43 executes a +1 incremental operation when the signal 41a is input from the distributor 20. The access counter 43 executes an incremental operation of a +n when the burst length is n and the signal 21 is input. The burst length is set in the access mode register 11. The access counter 43 determines the incremental operation of a +n with reference to the burst length.

The register 44 sets the value of the number of columns in a row that is to be accessed. The comparator 45 compares the count of the access counter 43 with the value set in the register 44. If the count output of the access counter 43 and the value of the register 44 coincides, the signal 14 for bank 0 is activated.

The operation for reading data from the SDRAM 300 is explained next. The burst length in the access mode register 11 is set as 1. The value in access counter 43 is set as 0. A predetermined value of the number of columns in a row is set in register 44. The signal 21 and the address signal 22 are input into the SDRAM control module 102 from a module that is not shown in the diagram.

In the first case, the access mode register 11 of the continuous access control unit 4a corresponding to bank 0 has the value of single access mode. The operation of the access by single access mode is similar to the first embodiment. The bank i access mode signal 13 that indicates single access mode is input into the SDRAM access control section 10 through a selecting circuit 32. The bank 0 is accessed in the single access mode.

In the second case, the access mode register 11 of the continuous access control unit 4a corresponding to bank 0 has the value of continuous access mode. The SDRAM access control section 10 recognizes the continuous access mode from the SDRAM access mode signal 15. The operation of the SDRAM access control section 10 is explained later. In this case, the signal 16 input from the selecting circuit 32 is inactive and the result of the comparator 45 becomes inconsistent.

The SDRAM access control section 10 issues a row activation command AC to the bank 0 when the SDRAM 300 is accessed for the first time. The SDRAM access control section 10 then issues a read command RD. The SDRAM access control section 10 maintains the row in an active state as it waits for the next request to access the SDRAM 300. In this case, the SDRAM access control section 10 does not issue a bank deactivation command PR. The SDRAM access control section 10 directly issues a read command RD as the row is active when the next column in the same row is accessed. In this case, the SDRAM access control section 10 does not issue a new row activation command AC. The operation is carried out till the last column in the same row is accessed.

The access counter 43 of the continuous access control unit 4a executes the incremental operation of a +1 when the signal 41a is input from the distributor 20. The last column in the same row is then accessed. The count of the access counter 43 coincides with the value of the register 44. The signal 14 for bank 0 that is output from the comparator 45 is activated. As a result, the signal 16 output from the selecting circuit 32 is also activated. If the signal 16 is activated, the SDRAM access control section 10 deactivates the bank 0 by precharging the bank 0. The SDRAM access control section 10 activates the next row and repeats the explained operation when the bank 0 is accessed again.

The process in the continuous access mode is explained next with reference to the chart shown in FIG. 8. The number of columns in a row is 512. The address signal 22 is updated as addresses a0, a1, and the like, when the signal 21 is input.

The signal 21 is asserted in clock cycle 1. The SDRAM access control section 10 issues a row activation command AC to activate the row in the bank 0 in clock cycle 1. The SDRAM access control section 10 issues a deselect command DS in the clock cycle 2. The SDRAM access control section 10 issues a read command RD in clock cycle 3. After the passage of CAS latency, the SDRAM 300 outputs the data signal 25 to the data bus in clock cycle 5. The signal 16 is not asserted in clock cycle 3 as the comparison result of the comparator 45 corresponding to the bank 0 is inconsistent. The SDRAM access control section 10 issues the deselect command DS to maintain the row in an active state in clock cycle 4 and 5. The SDRAM access control section 10 directly issues the read command RD as the signal 16 is negated. In this case, the SDRAM access control section 10 does not issue the row activation command AC.

The SDRAM 300 outputs the data signal 25 to the data bus after the passage of CAS latency in clock cycle 8. Eight clock cycles are hence required from the first signal 21 till the output of the second access data. The operation is carried out till the last column in the same row is accessed.

The signal 21 is input in clock cycle c. The last column in the row is accessed. The SDRAM access control section 10 outputs the read command RD in the clock cycle c. The detection signal 14 and the signal 16 are asserted in the clock cycle d as the result of the comparator 45 is inconsistent. Hence the SDRAM access control section 10 issues the bank deactivation command PR in the clock cycle d to deactivate the bank 0. The SDRAM 300 outputs the data signal 25 to the data bus in clock cycle e after the passage of CAS latency.

According to the third embodiment the continuous access mode has the same row address and continuous column address. The SDRAM access control section 10 activates the row when the SDRAM 300 is accessed for the first time and issues the read command RD. Another bank may be also be accessed in the middle of the reading process of bank 0. The SDRAM access control section 10 directly issues the read command RD before the last column in the row is accessed. The SDRAM access control section 10 directly issues the read command RD to prevent bank deactivation and row activation. It is hence possible to decrease the number of clock cycles required to access the SDRAM 300. It is also possible to ensure efficient access of memory.

It is possible to realize a circuit in an easy manner as the address signal is not employed for the determination of the last column in the row. The address signal wire is used to connect the circuit. The address signal wire is long, and has a long waiting period and high operating frequency. Hence, it has been proved to be disadvantageous to employ the address signal wire.

Moreover, it is possible to enhance the applicability of the SDRAM design. If the register 44 has the value of the number of accesses to SDRAM 300 and does not have the number of columns in a row, the bank is deactivated not for the last column of the row. The bank is also deactivated after maintaining the number of accesses to SDRAM 300 when the row is activated. Hence the enhancement of the SDRAM design has been improved.

The address holding section 33, the adder 34, and the circuit 36 may be added to the configuration of the third embodiment. The configuration and the operation of the address holding section 33, the adder 34, and the circuit 36 is explained in the second embodiment.

Figure 9:
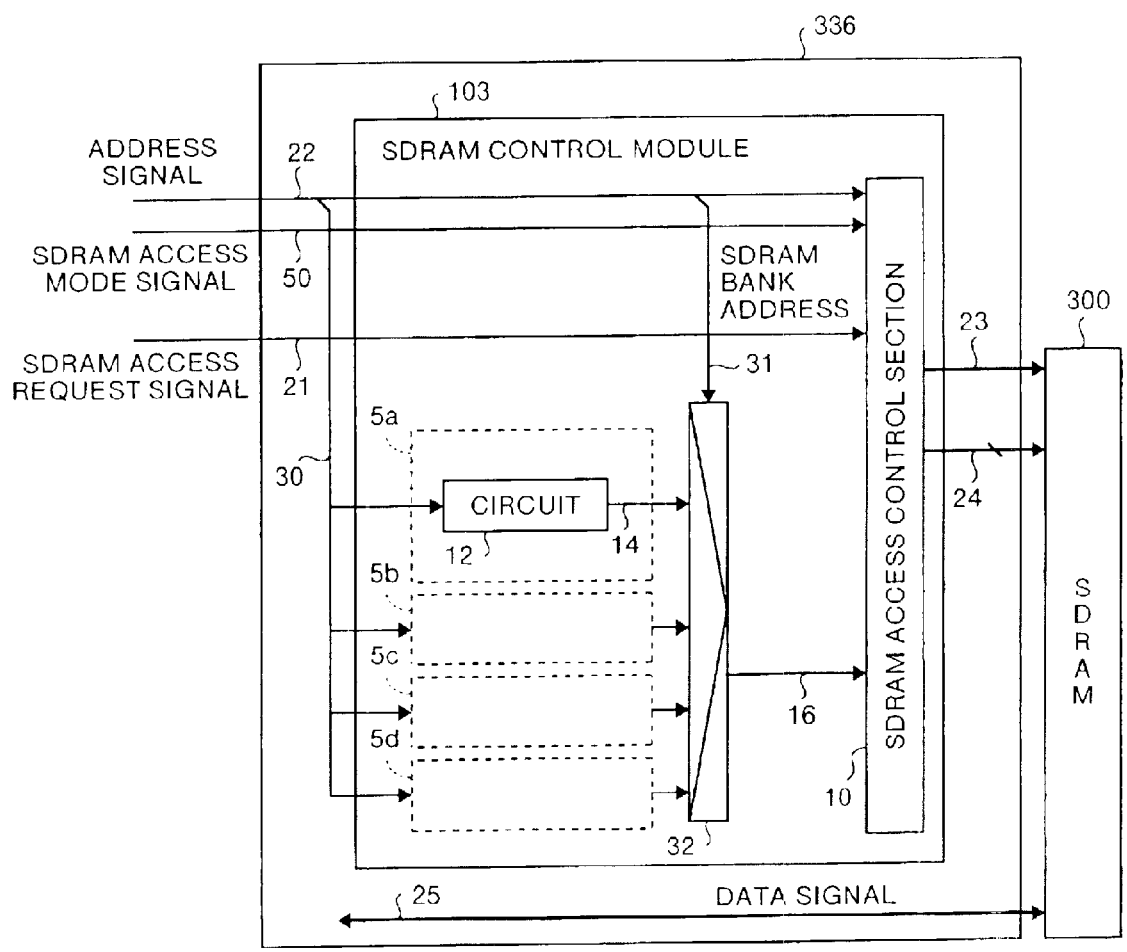
FIG. 9 is a block diagram that shows the configuration of an access controller according to a fourth embodiment of the present invention.

A fourth embodiment of the present invention is explained with reference to FIGS. 9 to 11. FIG. 9 shows an LSI 336 which includes an SDRAM control module 103 and the SDRAM 300. The configuration of the fourth embodiment is different from the preceding embodiments in that the access mode register 11 in the SDRAM control module 103 does not stores the value that indicates the continuous access mode or the single access mode as in the first to third embodiment. On the contrary, an SDRAM access mode signal 50 is directly input from a bus master to the SDRAM access control section 10.

The bus master is a module with a CPU, a DMA transfer controller (DMAC) and the like. The bus master generates a bus transaction after the SDRAM 300 is accessed. The SDRAM access mode signal 50 is selected by the bus master which is permitted to access the SDRAM 300. The SDRAM access mode signal 50 is selected from the SDRAM access mode signals that is output by a plurality of bus masters. The SDRAM access mode signal 50 is input in the clock cycles, along with signal 21. If the signal 21 is asserted during the input of signal 21, the SDRAM access control section 10 identifies that the access is by continuous access mode. If the signal 21 is negated during the input of signal 21, the SDRAM access control section 10 identifies that the access is by single access mode.

As shown in FIG. 9, the SDRAM control module 103 includes continuous access control units 5a to 5d. Each of the continuous access control units 5a to 5d includes the circuit 12. The circuit 12 detects the last column in a row in the corresponding bank. The access mode register 11 which sets the access mode is not provided here. As shown in FIG. 3, the circuit 12 includes a column address instruction register 40, a register 42, and a section 41. The register 42 sets the direction in which the address progresses. The section 41 monitors the column address. The circuit 12 operates in the same manner as explained in the third embodiment. The signal 14 is output from the circuit 12.

The selecting circuit 32 selects a signal from among the signals 14 output from each of the four continuous access control units 5a to 5d based on the SDRAM bank address 31. The selected signal 14 is input into the SDRAM access control section 10 as the signal 16.

The signal 21, the SDRAM access mode signal 50, and the signal 16 output by the selecting circuit 32 are input into the SDRAM access control section 10. The SDRAM access control section 10 generates SDRAM control signals 23 such as RAS, CAS, WE, and CS based on the signal 21, the SDRAM access mode signal 50 and the signal 16. In addition, the SDRAM access control section 10 processes the input address signal 22 by multiplexing to a suitable format for SDRAM 300. The input address signal 22 includes a bank address, a row address and a column address. The SDRAM access control section 10 inputs the address signal 24 and the bank address to the SDRAM 300 in the order of row address and column address.

The operation for reading data from SDRAM 300 is explained next. The SDRAM access mode signal 50 has the value of single access mode. The value that indicates the single access mode is set in the address mode register 11 for bank 0. The reading operation is the same as that explained in the first embodiment.

The operation in the continuous access mode is explained next. The SDRAM access control section 10 recognizes the continuous access mode from the SDRAM access mode signal 50. The operation of the access control section 10 when the signal 16 is not active is explained. The SDRAM access control section 10 issues a row activation command AC to the bank 0 of the SDRAM 300 only when the first access is made. The SDRAM access control section 10 then issues a read command RD. The SDRAM access control section 10 maintains the row in an active state while waiting for the next request to access the SDRAM 300. In this case, the SDRAM access control section 10 does not issue a deactivation command. The SDRAM access control section 10 directly issues the read command RD if the next column in the same row is accessed, as the row is activated. In this case, the SDRAM access control section 10 does not issue a new row activation command AC. The operation is carried out till the last column in the same row is accessed. The signal 16 is activated when the last column in the same row is accessed. Then the SDRAM access control section 10 deactivates the bank 0 by precharging. The SDRAM access control section 10 activates the next row when the bank 0 is accessed again. The same operation is repeated.

The process of the continuous access mode is explained in detail with reference to FIGS. 10 and 11. FIG. 10 shows the operation in the continuous access mode and FIG. 11 shows the operation in the single access mode.

Figure 10:
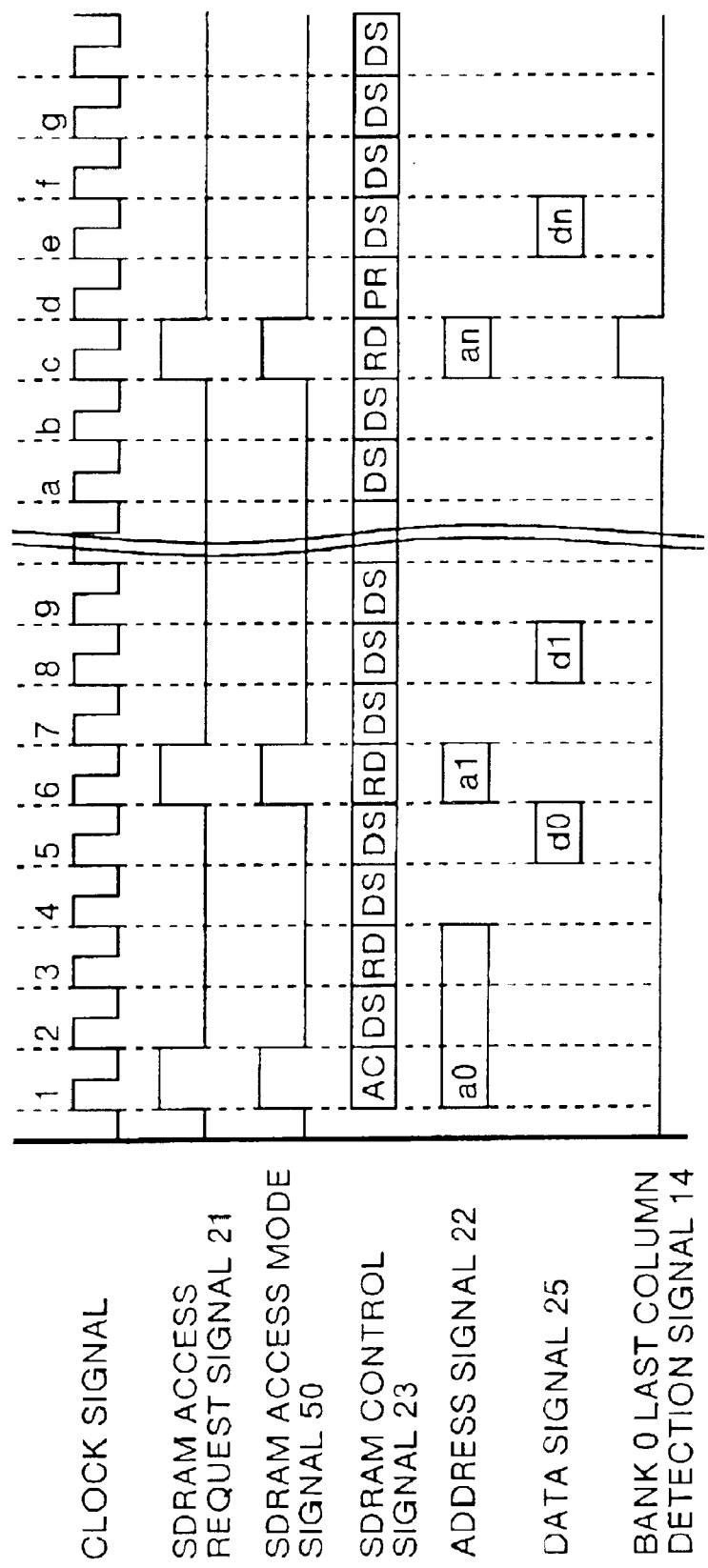
FIG. 10 is a time chart that explains the operation of the access controller according to the fourth embodiment in a continuous access mode.

As shown in FIG. 10, the signal 21 is asserted in clock cycle 1. The SDRAM access mode signal 50 in the continuous access mode is indicated by H in the clock cycle 1. The SDRAM access control section 10 issues a row activation command AC in the clock cycle 1. The SDRAM access control section 10 issues a deselect command DS in clock cycle 2. The SDRAM access control section 10 issues a read command RD in clock cycle 3. The SDRAM 300 outputs a data signal 25 to the data bus after the passage of CAS latency in clock cycle 5. The circuit 12 determines the column address section 30 of the SDRAM address signal 22 in clock cycle 3. The signal 14 and signal 16 are not asserted since the last column of the row is not accessed.

The SDRAM access mode signal 50 is in the continuous access mode during the input of signal 21. The signal 16 is not asserted in the clock cycle 3. The SDRAM access control section 10 issues the deselect command DS in clock cycles 4 and 5 to maintain the row in an active state.

The SDRAM access control section 10 directly issues the read command RD as the signal 16 is negated when the signal 21 and the SDRAM access mode signal 50 are input in clock cycle 6. In this case, the SDRAM access control section 10 does not issue the row activation command AC. The signal 21 is asserted in clock cycle 6. The SDRAM access mode signal 50 is in the continuous access mode. The SDRAM access mode signal 50 is at H level. The SDRAM access control section 10 issues the deselect command DS to maintain the row in an active state in clock cycle 7. The SDRAM 300 outputs the data signal 25 to the data bus after the passage of CAS latency in clock cycle 8. Hence eight clock cycles are required from the first request to access SDRAM 300 till the output of the second access data. The operation is carried out till the last column in the same row is accessed.

The signal 21 is again asserted in clock cycle c. The circuit 12 determines the column address section 30 of the SDRAM access signal 22. The circuit 12 asserts the signal 14 for bank 0 if the last column in the row is accessed. The signal 16 from the selecting circuit 32 is also asserted to the SDRAM 300.

The SDRAM access control section 10 issues the bank deactivation command PR to deactivate the bank 0 in clock cycle d. The SDRAM 300 outputs the data signal 25 to the data bus in clock cycle e after the passage of CAS latency.

Figure 11:
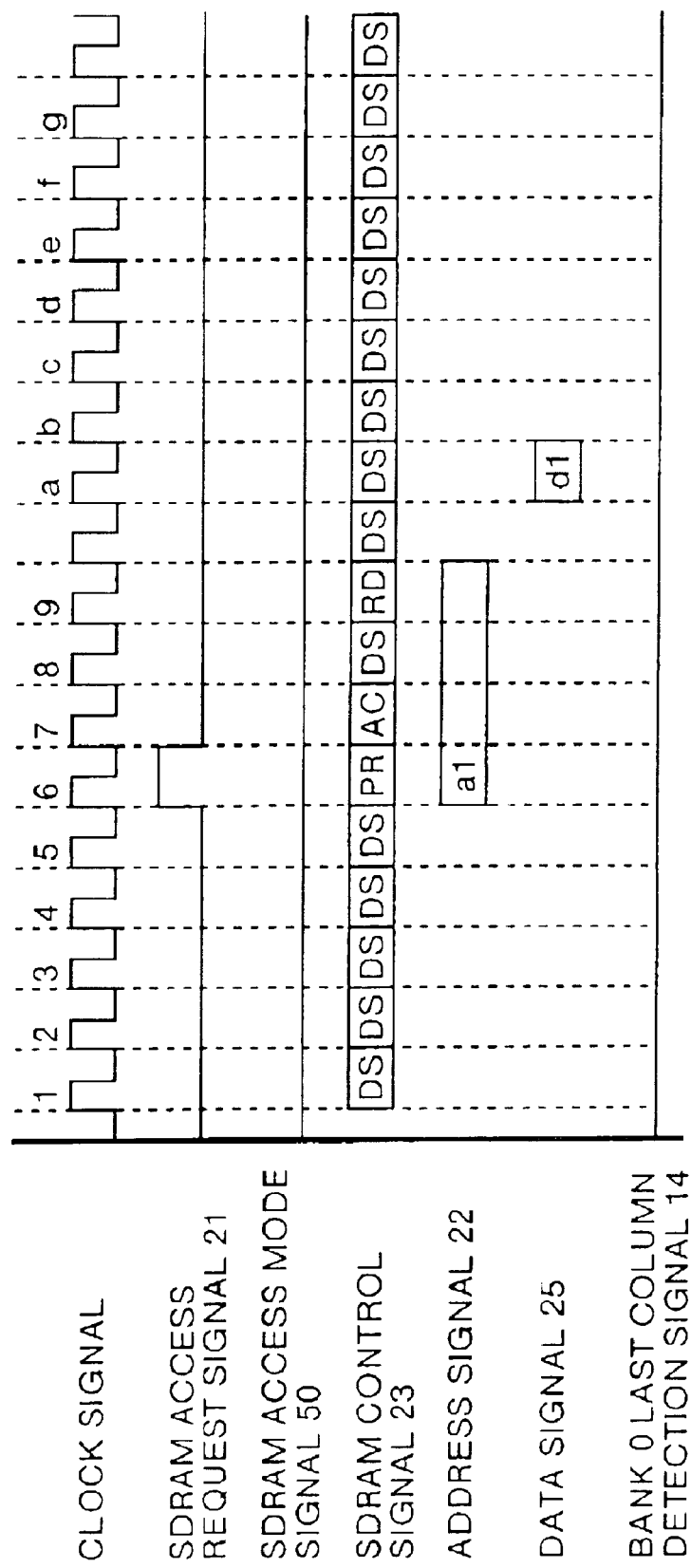
FIG. 11 is a time chart that explains the operation of the access controller according to the fourth embodiment in a single access mode.
Figure 12:
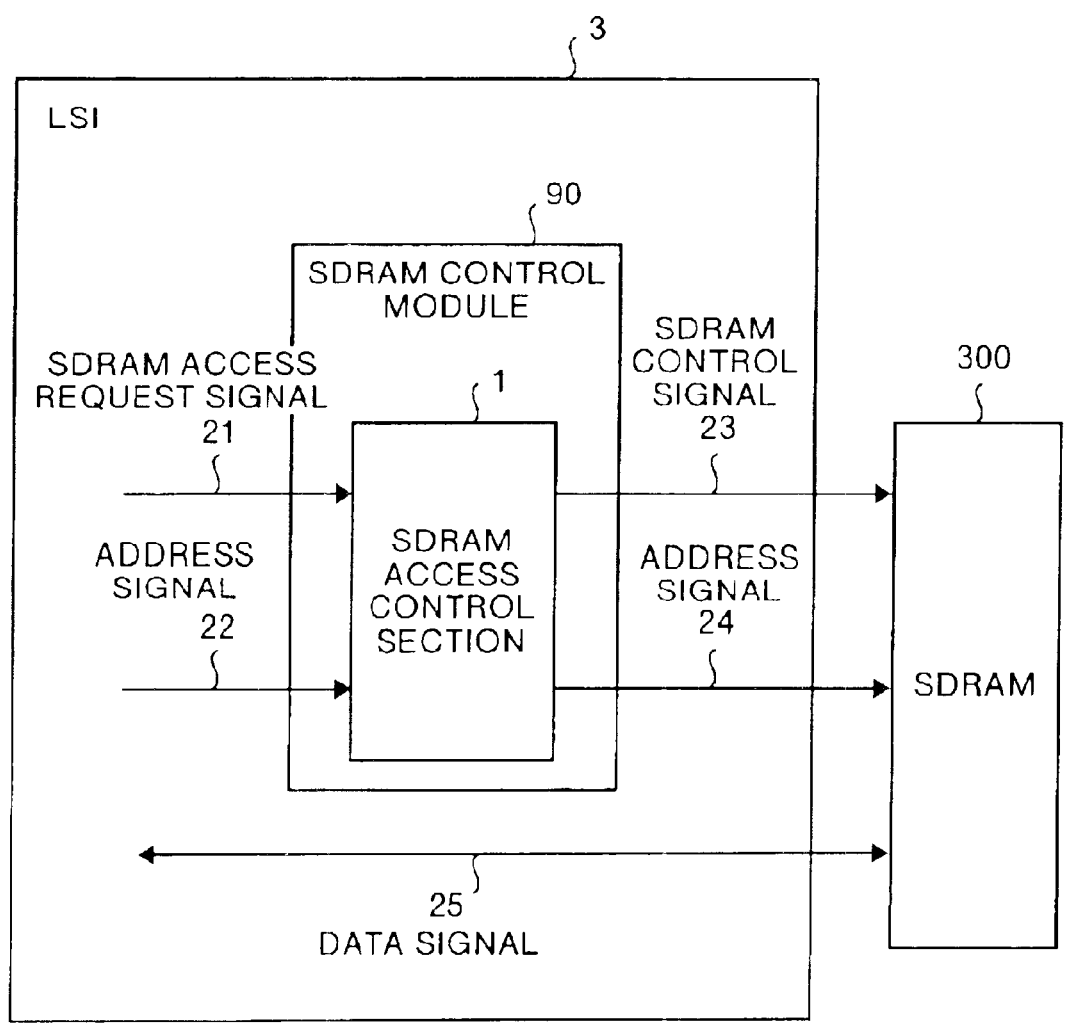
FIG. 12 is a block diagram that shows a conventional access controller.

As shown in FIG. 11, the SDRAM access mode signal 50 in the single access mode is L in the clock cycle 6. The signal 21 is asserted in the clock cycle 6. The SDRAM access control section 10 deactivates the bank by the bank deactivation command PR in clock cycle 6. The SDRAM access control section 10 activates the row by the row activation command AC in clock cycle 7. The read command RD is issued in clock cycle 9 after the passage of RAS-CAS latency. The SDRAM 300 outputs the data signal 25 to the data bus after the passage of CAS latency in clock cycle a.

According to the fourth embodiment, in the continuous access mode, the row address is the same and the column addresses are continuous. Another bank may be also be accessed in the middle of the reading process of bank 0. The read command RD is issued when the SDRAM 300 is accessed for the first time and the row is activated. The read command RD is directly issued to prevent bank deactivation and row activation before the last column in the row is accessed. The number of clock cycles required for SDRAM access is hence reduced. The efficient access of memory is also ensured. A simple circuit is configured as there is no need to provide hardware such as a register and the like. The applicability of the design is also improved. It is possible to automatically deactivate the bank and activate the row when a bank is accessed by a bus master and the same bank is accessed by another bus master. The bank is accessed in the continuous SDRAM access mode.

The internal configuration of the circuit 12 may be replaced by the configuration of the access counter 43, the register 44 and the comparator 45 as explained in the third embodiment. The address holding section 33, the adder 34 and the circuit 36 explained in the second embodiment may be also be added to the fourth embodiment. The write operation can also be carried out in the same manner as that of the read operation with the same advantages.

According to the present invention, the row of the synchronous semiconductor memory device is activated when a request to made to access the row in the continuous access mode. The read command RD or a write command is output to the synchronous semiconductor memory device. The accessed row is deactivated only when last column detection signal is asserted. The last column detection signal is asserted from the selecting circuit. It is hence possible to decrease the number of clock cycles required to access the synchronous semiconductor memory device. It is also possible to access the memory efficiently.

Moreover, it is possible to detect the access to the last column address of the synchronous semiconductor memory device.

Furthermore, a circuit can be designed such that it detects the access to the last column address of the synchronous semiconductor memory device. The access to the last column address is based on the comparison of the number of requests to access the SDRAM 400 with a predetermined value.

Moreover, access mode registers corresponding to respective banks are provided. The access mode signals are set in the access mode registers. The access control section identifies the continuous access mode from the information set in the access mode registers.

Furthermore, an access mode signal is input into the access control section from a bus master. It is hence not necessary to provide hardware such as a register to obtain a simple circuit. The applicability of the design is also improved. It is possible to automatically deactivate the bank and activate the row when a bank is accessed by a bus master and the same bank is accessed by another bus master.

In addition, in the continuous access mode, the accessed row is deactivated if the last column detection signal is asserted. The next row is indicated by the next address from the next address operation section. The next row that is input from the address selecting circuit is activated. The read or write command can be issued when the next row is accessed as the row is activated. Therefore the number of clock cycles required to access the SDRAM 300 is reduced.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. An access controller that executes in a continuous access mode, the access to columns in the same row of a synchronous semiconductor memory device that has a storage region divided into a plurality of banks, the access controller comprising:
    a plurality of last column detection circuits wherein one last column detection circuit is provided corresponding to each of the banks, wherein each of the last column detection circuits detects the access to a last column address in the continuous access mode and generates and outputs a last column detection signal;
    a selecting circuit that selects and outputs one last column detection signal from among the last column detection signal output by each of the last column detection circuits based on an address signal; and
    an access control section that activates the row of the synchronous semiconductor memory device when the row is accessed in the continuous access mode, outputs a read command or a write command without deactivating the accessed row each time there is a request for access until the last column detection signal output by the selecting circuit is asserted, and deactivates the accessed row when the last column detection signal output by the selecting circuit is asserted.

2. The access controller according to claim 1, wherein each of the last column detection circuit detects whether the access to the synchronous semiconductor memory device is an access to the last column address of the synchronous semiconductor memory device based on an address signal that is input into the synchronous semiconductor memory device.

3. The access controller according to claim 1, wherein each of the last column detection circuit detects whether the access to the synchronous semiconductor memory device is an access to the last column address of the synchronous semiconductor memory device based on the comparison of the count of access requests with a predetermined value.

4. The access controller according to claim 1, further comprising a plurality of access mode registers wherein one access mode register is provided corresponding to each of the banks, wherein each access mode register stores an access mode signal,
    wherein the selecting circuit selects and outputs one access mode signal from among the access mode signal stored in each of the access mode registers based on the address signal, and
    the access control section identifies whether access is in the continuous access mode based on the access mode signal output by the selecting circuit.

5. The access controller according to claim 1, wherein
    the access control section directly receives an access mode signal from a bus master, and
    the access control section identifies whether access is in the continuous access mode based on the access mode signal received by the access control section.

6. The access controller according to claim 1, further comprising:
    a next address calculation unit that calculates and outputs a next address of the address signal; and
    an address selecting circuit that selects the address signal to the synchronous semiconductor memory device after a predetermined period after the last column detection signal is asserted, and selects the next address output by the next address calculation section during the predetermined period,
    wherein in the continuous access mode, the access control section deactivates the accessed row if the last column detection signal from the select circuit is asserted, and then instantly activates a row indicated by the next address from the next address arithmetic operation section input from the address select circuit.

* * * * *